United States Patent [19]

Dunn

[11] Patent Number: 4,717,845

[45] Date of Patent: Jan. 5, 1988

[54] TTL COMPATIBLE CMOS INPUT CIRCUIT

[75] Inventor: William C. Dunn, Scottsdale, Ariz.

[73] Assignee: SGS Semiconductor Corporation, Phoenix, Ariz.

[21] Appl. No.: 192

[22] Filed: Jan. 2, 1987

[51] Int. Cl.⁴ .................. H03K 19/092; H03K 17/687; H03K 19/094; G05F 3/16

[52] U.S. Cl. .................................... 307/475; 307/451; 307/576; 307/579; 307/585; 307/270; 323/315

[58] Field of Search ............... 307/475, 451, 576, 579, 307/585, 270, 443, 110; 323/315, 316, 317; 320/1

[56] References Cited

U.S. PATENT DOCUMENTS

| | | | |
|---|---|---|---|
| 4,437,025 | 3/1984 | Liu et al. | 307/475 |
| 4,438,352 | 3/1984 | Mardkha | 307/475 |
| 4,469,959 | 9/1984 | Luke et al. | 307/475 |
| 4,471,242 | 9/1984 | Noufer et al. | 307/475 |
| 4,475,050 | 10/1984 | Noufer | 307/475 |
| 4,485,317 | 11/1984 | Davies, Jr. | 307/475 |
| 4,490,633 | 12/1984 | Noufer et al. | 307/475 |
| 4,555,642 | 11/1985 | Marales | 307/475 |
| 4,578,600 | 3/1986 | Magee | 307/475 |
| 4,584,491 | 4/1986 | Ulmer | 307/475 |
| 4,587,447 | 5/1986 | Baehring | 307/475 |

*Primary Examiner*—Stanley D. Miller
*Assistant Examiner*—Trong Quang Phan
*Attorney, Agent, or Firm*—M. David Shapiro

[57] ABSTRACT

A TTL compatible CMOS input circuit comprising a series of current mirror circuits arranged so that the input transistor is used to discharge the capacitive load and one of a pair of transistors in one of the current mirror circuits provides charging current for the load. Only one of the charging and discharging transistor switches in "on" at any one time, thus reducing circuit power consumption and reducing required device sizes. The input switching level is also independent of the supply voltage.

5 Claims, 2 Drawing Figures

U.S. Patent

Jan. 5, 1988

4,717,845

TTL COMPATIBLE CMOS INPUT CIRCUIT

FIELD OF THE INVENTION

The invention relates to a TTL compatible input circuit for CMOS devices.

BACKGROUND OF THE INVENTION

Figure 1:
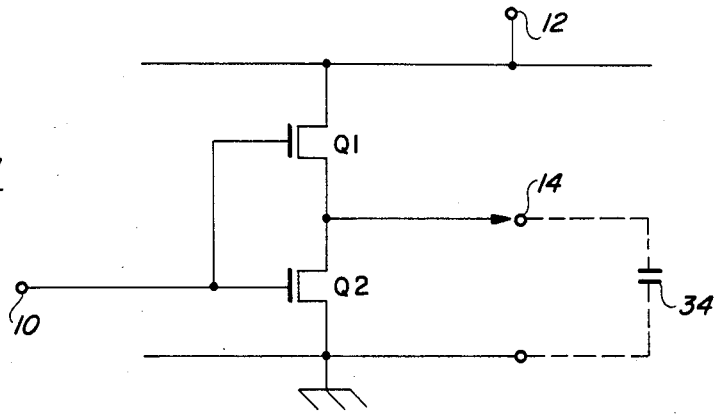

Prior art TTL compatible input circuits for CMOS devices are typified by the circuit of FIG. 1. Devices $Q_1$ (a P-type MOSFET) and $Q_2$ (an N-type) must be ratioed for a specific supply voltage, $V_{cc}$; that is, the ratio of the width to length of the gate of transistor $Q_1$ with respect to the same ratio of transistor $Q_2$ must be adjusted to attain the desired result for any particular supply voltage.

With a minimal high logic level TTL input voltage ($V_{IH}$) at input node 10 equal to 2.1 volts (which must be assumed for the purpose of reliable design), $Q_1$ is always conducting (independent of whether $Q_2$ is in an "on" or "off" state) and for a supply of 12 volts, the supply current drain is about 60 uA (or higher, depending upon the speed requirements of the circuit) with $Q_2$ "on." For $Q_2$ to sink the current from $Q_1$ and drive the output to ground with $V_{IN}=2.1$ volts, $Q_2$ must be very large.

The prior art circuit of FIG. 1 is subject to problems due to supply line voltage shifts (since the required ratio of gate sizes is dependent upon that voltage), requires relatively high DC current supply drain and has a relatively long propagation delay time, in addition to the aforementioned large area requirement of transistor $Q_2$.

U.S. Pat. No. 4,350,710, by Cohen et al., discloses a TTL to CMOS interface circuit which utilizes a FET inverter with its N channel being a part of a first current mirror and its P channel being part of a second current mirror. The inverter output is the reference signal input to the current mirrors. The current sources for each control leg of the two current mirror circuits are variable; in the first case to compensate for variations in the input signal, in the second case to compensate the inverter for manufacturing tolerances.

U.S. Pat. No. 4,472,647, by Allgood et al., also employs current mirror circuits in a design which accepts either CMOS or TTL level input signals. Neither of these patents discloses a circuit such as the one described, infra.

SUMMARY OF THE INVENTION

Problems of prior art circuits are resolved by means of the TTL compatible CMOS input circuit of the invention. A band-gap or other voltage regulator means is used to provide a constant current through a series current limiting resistance; such constant current being supplied to one or more of the circuits of the invention. A series of MOSFET device pairs, connected in well known current mirror relationship, are used to provide input "turn on" and "turn-off" levels which are independent of supply voltage variations. One of the series of current mirror circuits is used to charge the output load capacitance at approximately a 100 microampere rate while the input transistor is used to discharge the same load at nearly the same rate. This arrangement provides for a balanced high speed circuit while consuming lower power from the system power supply since only one of the two (charging and discharging) transistors is drawing current at any one time.

It is, therefore, an object of the invention to provide a TTL compatible CMOS input circuit which has an improved (reduced) propagation delay time.

It is another object of the invention to provide a TTL compatible CMOS input circuit with improved (smaller) device sizes.

It is yet another object of the invention to provide a TTL compatible CMOS input circuit which requires improved (lower) current drain from a power source.

It is still another object of the invention to provide a TTL compatible CMOS input circuit which operates reliably within a wide range of supply line voltages.

Figure 2:
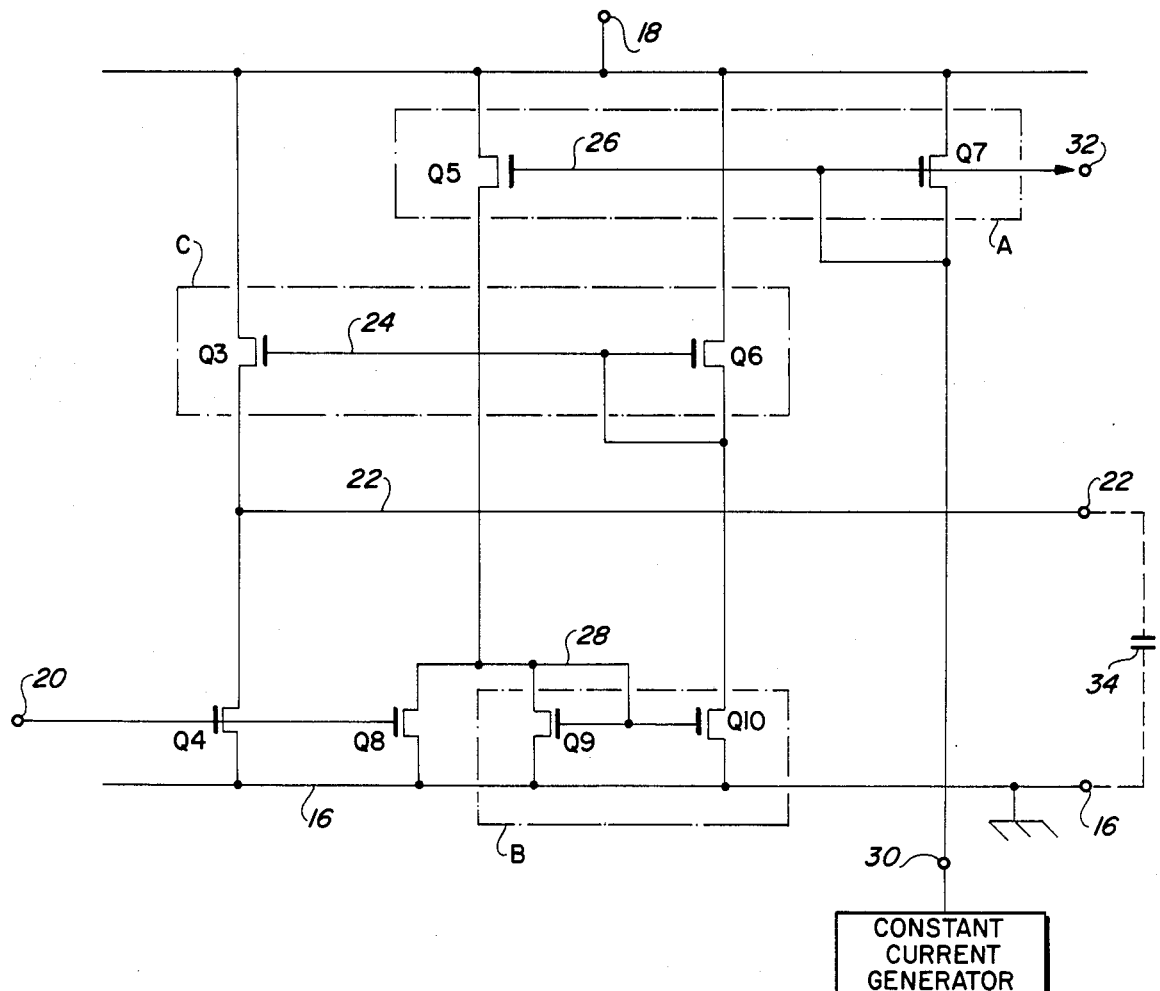

These and other objects of the invention will be more readily understood upon review of the Detailed Description of the Preferred Embodiment of the Invention in view of the drawings in which:

FIG. 1 depicts, in schematic form, a prior art TTL compatible CMOS input circuit; and FIG. 2 is a schematic diagram of the preferred embodiment of the TTL compatible CMOS circuit of the invention.

DETAILED DESCRIPTION OF THE PREFERRED EMBODIMENT OF THE INVENTION (It should be noted that wherever in this specification like reference numerals are used they refer to like features.)

Referring to the schematic diagram of the invention in FIG. 2, it should be understood that $Q_3$, $Q_5$, $Q_6$ and $Q_7$ are P-channel and $Q_4$, $Q_8$, $Q_9$ and $Q_{10}$ are N-channel Metal Oxide Semiconductor Field Effect Transistor (MOSFET) devices. Circuit input terminal 20 is connected to the gates of devices $Q_4$ and $Q_8$. The source electrodes of $Q_4$ and $Q_8$ are connected to ground. The drain electrode of $Q_4$ is connected to the drain electrode of $Q_3$ and to output node 22. The drain electrodes of $Q_8$ and $Q_9$ are connected to the gate of $Q_9$, the gate of $Q_{10}$ and the drain electrode of $Q_5$. $Q_9$ and $Q_{10}$ comprise current mirror circuit B.

The source electrodes of $Q_3$ and $Q_5$ are connected to $V_{cc}$ 18, the supply voltage. The source electrode of $Q_{10}$ is connected to ground. The drain electrode of $Q_{10}$ is connected to the drain electrode of $Q_6$, to the gate electrode of $Q_6$ and to the gate electrode of $Q_3$. $Q_3$ and $Q_6$ comprise current mirror circuit C. The source electrode of $Q_6$ is connected to $V_{cc}$ 18, voltage supply. The gate electrode of $Q_5$ is connected to the gate electrode of $Q_7$, to the drain electrode of $Q_7$, to output terminal 32 and to input terminal 30, which is adapted for connection to the output of constant current generator 36. The source electrode of $Q_7$ is connected to $V_{cc}$ 18, voltage supply. $Q_5$ and $Q_7$ comprise current mirror circuit A.

Load capacitance, 34 (shown in phantom), is connected between output and charge/discharge node 22 and ground 16.

Constant current generator 36 is used to supply on the order of from one to five microamperes of current to the source electrode of MOSFET $Q_7$. The constant current generator 36 may take the form of a band-gap voltage regulator with a series current limiting resistor (or one of many other possible forms), as will be well understood by one of ordinary skill in this art. This completes the detailed description of the circuit connections of the invention.

OPERATION OF THE PREFERRED EMBODIMENT OF THE INVENTION

If, for example, the constant current generator 36, connected to input terminal 30 of the invention is designed to produce a constant current of five microamperes through $Q_7$, a first current mirror A, comprising $Q_7$ and $Q_5$, may be adjusted so that $Q_5$ also passes five microamperes of current by making the ratios of the width to length of the gates of each of $Q_7$ and $Q_5$ equal (a 1:1 ratio of these ratios). When transistors $Q_4$ and $Q_8$ are turned off by a low input logic voltage appearing on input terminal 20, transistor $Q_5$ provides the required five microamperes electron flow to the drain electrode of transistor $Q_9$.

MOSFET transistors $Q_9$ and $Q_{10}$ comprise a second current mirror circuit. Therefore, $Q_{10}$ provides five microamperes to transistor $Q_6$, if the ratio of the ratios of gate widths to lengths of $Q_9$ and $Q_{10}$, respectively, are equal. Transistors $Q_6$ and $Q_3$ comprise still a third current mirror C, but with a difference. The gate size ratio between these two transistors may be 20:1 so that transistor $Q_3$ may provide 100 microamperes for the purpose of charging load capacitor 34. The electron charging path for the 100 microampere charging current is from ground, through capacitor 34 and transistor $Q_3$ to the positive supply, $V_{cc}$ 18, thereby charging capacitor 34 negative on its grounded side and positive on its upper side.

When MOSFET transistors $Q_4$ and $Q_8$ are turned on by a "high" logic signal on input terminal 20, $Q_8$ provides the required five microamperes to transistor $Q_5$, shunts $Q_9$, turning it off and therefore transistor $Q_{10}$ is also turned off. Transistor $Q_6$ is turned off and its mirror transistor, $Q_3$ is also turned off. Input MOSFET transistor $Q_4$ is then effectively a low impedance shunt switch across load capacitor 34 and provides approximately 100 microamperes of discharge current to load capacitor 34.

Since only one of the two high current carrying transistors $Q_3$ and $Q_4$ are turned on at any one time, the maximum current drawn by these two transistors does not exceed that drawn by either of them. Furthermore, since the charge and discharge currents for capacitor 34 are essentially equal, the charge and discharge times are also essentially equal and the propagation delay time in either case may be made to be equal or nearly so. The input turn on and turn off voltages are not affected by variations in supply voltage 18, since both turn on and turn off voltages are controlled a constant current, ultimately controlled by constant current generator 36.

While the invention has been particularly shown and described herein with reference to a preferred embodiment thereof, it will be understood by those skilled in the art that various other modifications and changes may be made to the present invention from the principles of the invention as herein described without departing from the spirit and scope as encompassed in the accompanying claims. Therefore, it is intended in the appended claims to cover all such equivalent variations which may come within the scope of the invention as described.

What is claimed is:

1. A TTL compatible CMOS input circuit for providing a charging and a discharging current to an essentially capacitive load connected to an output terminal of the CMOS input circuit, the CMOS input circuit comprising in combination:

a plurality of current mirror transistor pair means for providing a charging current to the capacitive load, each of said plurality of current mirror transistor pair means having a constant current input terminal and a mirror current terminal, said constant current input terminal of a first of said plurality of current mirror transistor pair means being connected for accepting a reference current from a constant current generator, said constant current input terminal of a second of said plurality of current mirror transistor pair means being connected to said mirror current terminal of said first of said plurality of current mirror transistor pair means, said mirror current terminal of said second of said plurality of current mirror transistor pair means being connected to said constant current input terminal of a third of said plurality of current mirror transistor pair means, said mirror current terminal of said third of said plurality of current mirror transistor pair means being connected to said load capacitance; and means for switching at least one of said plurality of current mirror transistor pair means from a first state to a second state in response to a TTL logic level shift at an input terminal of said means for switching, wherein said first state is one of an "off" and "on" state and said second state is the other of said "off" and "on" state, said means for switching having a first and a second output terminal, said first output terminal of said switching means being connected to said constant current input terminal of said second of said plurality of said current mirror transistor pair means, said second output terminal of said switching means being connected to said current mirror terminal of said third of said plurality of said current mirror transistor pair means for discharging said capacitive load.

2. The CMOS input circuit according to the circuit of claim 1 wherein each of said first, second and third current mirror transistor pairs further comprises a first and a second MOSFET transistor, both of said first and second MOSFET transistors being of a single type chosen from the group, N-type and P-type, each of said first MOSFET transistors having a gate electrode thereof connected to a drain electrode thereof and to a gate electrode of said second MOSFET transistor of said current mirror transistor pair.

3. The CMOS input circuit according to the circuit of claim 2 wherein said drain and gate electrodes of said first MOSFET transistor of first current mirror transistor pair are connected to the constant current input terminal and said drain electrode of said second MOSFET transistor of said first current mirror transistor pair is connected to said drain and gate electrodes of said first MOSFET transistor of said second current mirror transistor pair, a drain electrode of said second MOSFET transistor of said second current mirror transistor pair is connected to said drain and gate electrodes of said first MOSFET transistor of said third current mirror transistor pair, a drain electrode of said second MOSFET transistor of said third current mirror transistor pair being connected to a first terminal for connection to one side of the essentially capacitive load and to a drain electrode of said means for switching, a second side of the essentially capacitive load being connected to a first voltage reference terminal, a drain electrode of each of said first and second MOSFET transistors of said first current mirror transistor pair and said first and second MOSFET transistors of said third current mirror transistor pair being connected to a second reference voltage, a gate electrode of said switching means being connected to an input terminal of the TTL compatible CMOS input circuit, a gate electrode of a shunt MOSFET transistor being connected to said input terminal of the TTL compatible CMOS input circuit, a drain electrode of said shunt MOSFET transistor being connected to said gate and drain electrodes of said second current mirror transistor pair, a source electrode of each of said first and second MOSFET transistors of said first current mirror transistor pairs and a source electrode of each of said switching means and said shunt transistor being connected to said first voltage reference.

4. A compatible circuit of translating a TTL input signal level to a CMOS circuit signal level for driving a CMOS circuit load, the CMOS circuit load comprising an essentially capacitive load, the input TTL signal having one of two states in which:

the capacitive load being charged in response to a first of the two TTL input states, said charging being accomplished by means of a plurality of current mirror circuits each of said plurality of current mirror circuits comprising a transistor pair, each of said transistor pairs being of a single type chosen from N-type and P-type MOSFETs, each of said plurality of current mirror circuits having a constant current input terminal and a mirror current terminal, a first of said constant current input terminals of a first of said plurality of current mirror circuits for connection to a constant current generator, a corresponding first mirror current terminal of said first of said plurality of current mirror circuits being connected to a second constant current input terminal of a second of said plurality of current mirror circuits, a corresponding second mirror current terminal of said second of said plurality of current mirror circuits being connected to a third constant current input terminal of a third of said plurality of current mirror circuits, a corresponding third mirror current terminal of said third of said plurality of current mirror circuits being connected to the capacitive load; and the capacitive load being charged in response to a second of the two TTL input states, said discharging being accomplished by means of a switching circuit, said switching circuit having two output terminals, a first of said two output terminals being utilized to control turn on and turn off of at least one of the plurality of current mirror circuits, a second of said two output terminals being utilized to discharge the capacitive load.

5. The circuit according to claim 4 including means for providing that only one of said switching circuit and said at least one of said plurality of current mirror circuits being turned on at any one point in time.

* * * * *